United States Patent
Kang et al.

(10) Patent No.: US 6,590,251 B2
(45) Date of Patent: Jul. 8, 2003

(54) SEMICONDUCTOR DEVICES HAVING METAL LAYERS AS BARRIER LAYERS ON UPPER OR LOWER ELECTRODES OF CAPACITORS

(75) Inventors: Sang-bom Kang, Seoul (KR); Hyun-seok Lim, Kyungki-do (KR); Yung-sook Chae, Kyungki-do (KR); In-sang Jeon, Kyungki-do (KR); Gil-heyun Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/911,313

(22) Filed: Jul. 23, 2001

(65) Prior Publication Data

US 2002/0000598 A1 Jan. 3, 2002

Related U.S. Application Data

(62) Division of application No. 09/511,598, filed on Feb. 23, 2000, now Pat. No. 6,287,965.

(30) Foreign Application Priority Data

Dec. 8, 1999  (KR) ............................................. 99-55835
Feb. 10, 2000 (KR) ............................................ 2000-6251

(51) Int. Cl.[7] ............................................. H01L 27/108
(52) U.S. Cl. ...................... 257/310; 257/301; 257/750; 257/761; 257/763; 257/765
(58) Field of Search ................................. 257/750, 301, 257/761, 763, 765, 771, 310

(56) References Cited

U.S. PATENT DOCUMENTS 6,120,842 A    9/2000  Lu et al. ..................... 427/250
6,284,646 B1 * 9/2001  Leem .......................... 438/269
6,358,810 B1 * 3/2002  Dornfest et al. ............. 438/396
6,368,910 B1 * 4/2002  Sheu et al. .................. 438/240

FOREIGN PATENT DOCUMENTS

KR    P1999-012246    2/1999
KR    1999-0040442    6/1999
KR    1999-0051335    7/1999

OTHER PUBLICATIONS

Kim et al., *Anti–Oxidation Properties of TiAlN film Prepared by Plasma–Assisted Chemical Vapor Deposition and Roles of Al*, Thin Solid Films, vol. 307, pp. 113–119 (1997).
Notice to Submit Response, Korean App. No. 10–2000–0006251, Dec. 21, 2001.

* cited by examiner

*Primary Examiner*—Richard Elms
*Assistant Examiner*—Brad Smith
(74) *Attorney, Agent, or Firm*—Myers Bigel Sibley & Sajovec

(57) ABSTRACT

Semiconductor films include insulating films including contact holes in semiconductor substrates, capacitors comprising lower electrodes formed on conductive material films in the contact holes, high dielectric films formed on the lower electrodes and upper electrodes formed on the high dielectric films, and barrier metal layers positioned between conductive materials in the contact holes and the lower electrodes, the barrier metal layers including metal layers formed in A-B-N structures in which a plurality of atomic layers are stacked by alternatively depositing reactive metal (A), an amorphous combination element (B) for preventing crystallization of the reactive metal (A) and nitrogen (N). The composition ratios of the barrier metal layers are determined by the number of depositions of the atomic layers.

13 Claims, 15 Drawing Sheets

TiAlN

TiN

SEMICONDUCTOR DEVICES HAVING METAL LAYERS AS BARRIER LAYERS ON UPPER OR LOWER ELECTRODES OF CAPACITORS

CROSS-REFERENCE TO RELATED APPLICATIONS

The present application is a divisional application of Ser. No. 09/511,598, filed Feb. 23, 2000, now U.S. Pat. No. 6,287,965, the disclosure of which is incorporated herein by reference in its entirety.

BACKGROUND OF THE INVENTION

1. Field of the Invention

The present invention relates to a method of forming a metal layer using atomic layer deposition and a semiconductor device having the metal layer as a barrier metal layer or the upper or lower electrode of a capacitor.

2. Description of the Related Art

As the integration density of semiconductor devices increases, high dielectric materials having a large dielectric constant have been developed to obtain large capacitance in a small area. For example, a BST ($BaSrTiO_3$) film having a perovskite crystal structure has a dielectric constant of about several hundreds through one thousand in a bulk state, which is different to a silicon nitride film, a silicon oxy-nitride film and a tantalum oxide ($Ta_2O_5$) film which are conventionally used for a capacitor. A BST film is advantageous in that a thin dielectric film can be implemented such that an equivalent oxide thickness is less than 10 Å even when the thickness of the BST film is more than 500 Å. An electrode such as platinum (Pt) which is not oxidized may be used for a BST electrode. An electrode such as ruthenium (Ru) or iridium (Ir), which holds the characteristics of a conductor even if it is oxidized and forms oxide ruthenium ($RuO_2$) or oxide iridium ($IrO_2$), may also be used for a BST electrode.

To obtain a high dielectric BST film having excellent capacitance and leakage current characteristics, a thermal process needs to be performed at a high temperature after depositing BST film. At this time, a barrier metal layer needs to be formed to prevent oxidation of an ohmic layer and a polysilicon plug due to diffusion of oxygen. The barrier metal layer is interposed between the polysilicon plug and a lower electrode.

Conventionally, a titanium nitride (TiN) film is usually used for the barrier metal layer, but the TiN film is oxidized at a temperature of more than 450° C. When a high temperature thermal process is performed in an oxygen atmosphere after depositing a BST film, a TiN film and a polysilicon plug are oxidized because platinum (Pt) lets oxygen easily pass through. Especially, a non-conductive $TiO_2$ film is formed when the TiN film is oxidized. In addition, platinum (Pt) and silicon (Si) is diffused into the TiN film, and thus the TiN film cannot act as a barrier metal layer. It is known that the diffusion of Pt and Si is caused by the columnar structure of TiN. Accordingly, it is necessary to restrain the diffusion of oxygen by implementing an amorphous structure which dose not have a grain boundary acting as a path of diffusion.

From this necessity, compounds containing a refractory metal have been studied. A barrier metal layer formed of a compound containing a refractory metal has a problem that adjustability and reproducibility of composition is decreased when the compound is deposited by chemical vapor deposition, due to the complexity of the composition. Accordingly, a reactive sputtering process is usually performed in a nitrogen atmosphere when forming a barrier metal layer of a compound containing a refractory metal. However, a barrier metal layer formed by a sputtering process has a poor step coverage so that it cannot be suitable for a barrier metal layer in a capacitor, the structure of which becomes more complex as the integration density of a semiconductor device increases, for example, a barrier metal layer which is formed at the lower portion of a trench having a high aspect ratio in a trench type capacitor.

SUMMARY OF THE INVENTION

To solve the above problems, it is the first object of the present invention to provide a method of forming a metal layer using atomic layer deposition, which has an excellent step coverage and prevents diffusion of oxygen, by which method the composition of the metal layer can be appropriately adjusted so as to easily provide a desirable resistance and conductivity.

It is the second object of the present invention to provide a semiconductor device having the metal layer formed by the above method as a barrier metal layer or the upper or lower electrode of a capacitor.

Accordingly, to achieve the first object, the present invention by a first aspect provides a method of forming a metal layer having an A-B-N structure in which a plurality of atomic layers are stacked by individually injecting pulsed source gases for a reactive metal (A), an amorphous combination element (B) for preventing crystallization of the reactive metal (A) and nitrogen (N), and nitrogen (N) and allowing the source gases to be chemically adsorbed to a semiconductor substrate.

In particular, the source gases are alternately injected in a predetermined order to alternately arrange the atomic layers, and the number of injection pulses of each source gas is adjusted to determine the composition of the metal layer.

The reactive metal (A) may be titanium (Ti), tantalum (Ta), tungsten (W), zirconium (Zr), hafnium (Hf), molybdenum (Mo) or niobium (Nb). The amorphous combination element (B) for preventing crystallization of the reactive metal (A) and the nitrogen (N) may be aluminum (Al), silicon (Si) or boron (B). In addition, the electrical conductivity and resistance of the metal layer may be determined by adjusting the number of injection pulses of a source gas for the amorphous combination element. The content of Al with respect to Ti may be 10–35% in a TiAlN layer when the metal layer is the TiAlN layer.

Further, according to a second aspect of the present invention, a plurality of oxygen diffusion preventing layers, e.g., aluminum oxide layers, may be formed in alternation with a plurality of metal layers so as to form a multiple metal layer including a plurality of metal layers and a plurality of oxygen diffusion preventing layers. Here, the oxygen diffusion preventing layer may be formed by alternately applying pulsed injections of source gases for a metal element and oxygen to the semiconductor substrate including the metal layer. The oxygen diffusion preventing layer may be formed by performing the steps of forming a material layer containing oxygen on the metal layer using atomic layer deposition and thermal-processing the semiconductor substrate including the metal layer and the material layer.

To achieve the second object, the present invention also provides a semiconductor device including an insulating film including a contact hole in a semiconductor substrate, a conductive material film formed on the bottom of the contact hole, and a capacitor including a lower electrode formed on the conductive material film in the contact hole, a high dielectric film formed on the lower electrode and an upper electrode formed on the high dielectric film.

In particular, the semiconductor device has a barrier metal layer between the conductive material film in the contact hole and the lower electrode. The barrier metal layer may be a metal layer formed in an A-B-N structure in which a plurality of atomic layers are stacked by alternately depositing a reactive metal (A), an amorphous combination element (B) for preventing crystallization of the reactive metal (A) and nitrogen (N), and nitrogen (N). The composition ratio of the barrier metal layer may be determined by the number of depositions of each atomic layer.

The reactive metal (A) may be titanium (Ti), tantalum (Ta), tungsten (W), zirconium (Zr), hafnium (Hf), molybdenum (Mo) or niobium (Nb). The amorphous combination element (B) for preventing crystallization of the reactive metal (A) and the nitrogen (N) may be aluminum (Al), silicon (Si) or boron (B). In addition, the electrical conductivity and resistance of the barrier metal layer may be determined by the number of injection pulses of an atomic layer of the amorphous combination element (B) to the total number of injection pulses used for the barrier metal layer.

The semiconductor device of present invention may also include an oxygen diffusion preventing layer, e.g., an aluminum oxide layer, on the metal layer. Accordingly, the barrier metal layer may be formed of a multiple metal layer including a plurality of metal layers and a plurality of oxygen diffusion preventing layers. In addition, a material layer containing oxygen may be formed on the oxygen diffusion preventing layer.

Further, to achieve the second object, the present invention provides a semiconductor device including a semiconductor device having a capacitor including a lower electrode formed on a predetermined material film on a semiconductor substrate, a high dielectric film formed on the lower electrode and an upper electrode formed on the high dielectric film.

In particular, the lower electrode may be formed in an A-B-N structure in which a plurality of atomic layers are stacked by alternately and sequentially depositing atomic layers of a reactive metal (A), an amorphous combination element (B) for preventing crystallization of the reactive metal (A) and nitrogen (N), and nitrogen (N). The composition of the lower electrode can be determined by the number of depositions of each atomic layer. The upper electrode may be formed in the same manner as the lower electrode.

The reactive metal (A) may be titanium (Ti), tantalum (Ta), tungsten (W), zirconium (Zr), hafnium (Hf), molybdenum (Mo) or niobium (Nb). The amorphous combination element (B) for preventing crystallization of the reactive metal (A) and the nitrogen (N) may be aluminum (Al), silicon (Si) or boron (B). In addition, the electrical conductivity and resistance of the lower electrode may be determined by the number of injection pulses of an atomic layer of the amorphous combination element (B) to the total number of injection pulses used for the lower electrode.

As described above, a metal layer (a multiple metal layer) formed by atomic layer deposition of the present invention has a high thermal resistant and high oxidation resistant characteristics. Since the metal layer is formed by individually depositing atomic layers, the step coverage thereof is excellent even in a very compact region. In addition, since individual atomic layers are adsorbed and formed in a predetermined order, the composition ratio of each element contained in the metal layer can be easily adjusted. A metal layer formed by atomic layer deposition of the present invention may be employed as a barrier metal layer, a lower electrode or an upper electrode in a semiconductor device.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1A:
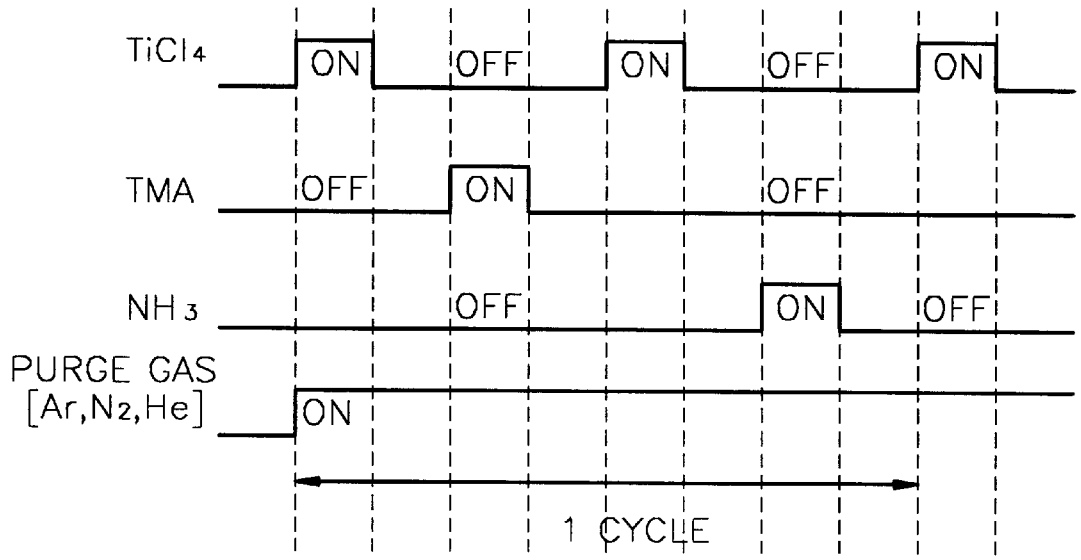
FIGS. 1A and 1B are graphs for showing an example of a method of injecting source and purge gases for deposition of an atomic layer when a metal layer is formed according to a first aspect of the present invention.

With reference to the accompanying drawings, the preferred embodiments of the present invention will be described.

Method for Forming Metal Layer Using Atomic Layer Deposition According to First Aspect of the Present Invention Atomic layer deposition is a method of sequentially depositing a plurality of atomic layers on a semiconductor substrate by sequentially injecting and removing reactants into and from a chamber. The atomic layer deposition uses a chemical reaction like chemical vapor deposition (CVD), but it is different to CVD in that reactant gases are individually injected in the form of a pulse instead of simultaneously injecting reactant gases, so they are not mixed in the chamber. For example, in case of using gases A and B, gas A is first injected into a chamber and the molecules of gas A are chemically adsorbed to the surface of a substrate, thereby forming an atomic layer of A. The gas A remaining in the chamber is purged using an inert gas such as an argon gas or a nitrogen gas. Thereafter, the gas B is injected and chemically adsorbed, thereby forming an atomic layer of B on the atomic layer of A. Reaction between the atomic layer of A and the atomic layer of B occurs on the surface of the atomic layer of A only. For this reason, a superior step coverage can be obtained regardless of the morphology of a surface. After the reaction between the atomic layers of A and B, gas B remaining in the chamber and byproducts of the reaction are purged. The thickness of a film can be adjusted in atomic layer units by repeating injection of gas A or B and deposition of an atomic layer.

The following description concerns a method for forming a metal layer using atomic layer deposition according to a first aspect of the present invention. The metal layer is formed in a structure in which a plurality of atomic layers are stacked in an A-B-N structure, wherein A is a reactive metal, B is an element for amorphous combination, and N is nitrogen. The reactive metal (A) is a transition metal such as titanium (Ti), tantalum (Ta), tungsten (W), zirconium (Zr), hafnium (Hf), molybdenum (Mo) or niobium (Nb). The amorphous combination element (B) is either aluminum (Al), silicon (Si) or boron (B). The amorphous combination element (B) may also be the same as the element used for the reactive metal (A).

The amorphous combination element (B) prevents combination of the reactive metal (A) and nitrogen (N), thereby forming a metal layer having an amorphous structure. The amorphous combination element (B) also prevents a metal layer having an A-B-N structure from being crystalized in a succeeding thermal process.

A representative metal layer of the present invention is a titanium aluminum nitride (TiAlN) film. One among titanium chloride (TiCl$_4$), tetrakis demethyl amino titanium (TDMAT) and tetrakis deethyl amino titanium (TDEAT) is used as a source gas for Ti when forming a TiAlN layer. One among trimethyl aluminum (TMA), triethyl aluminum (TEA), tri-I-buthyl aluminum (TIBA) and AlClx is used as a source gas for Al. One among N$_2$ and NH$_3$ is used as a source gas for N.

In forming a TiAlN layer, a semiconductor substrate is first loaded in an atomic layer deposition chamber. Subsequently, source gases for three elements constituting a metal layer, i.e., a reactive metal (A), aluminum (Al) and nitrogen (N), are supplied from a gas supply unit through a gas supply pipe into the atomic layer deposition chamber. The source gases are individually and alternately supplied in the form of a pulse, thereby stacking Ti, Al and N atomic layers on the semiconductor substrate. The composition ratios of Ti, Al and N in the metal layer can be adjusted by appropriately determining the injection order of the source gases, the number of injections of each gas, and the injection time of source gases. Particularly, the composition of the metal layer can be adjusted according to the number of depositions of an atomic layer of an amorphous combination element, for example, Al, so that a desired electrical conductivity and resistance of the metal layer can be provided. The following description concerns examples of adjustment of composition of Ti, Al and N.

Figure 1B:
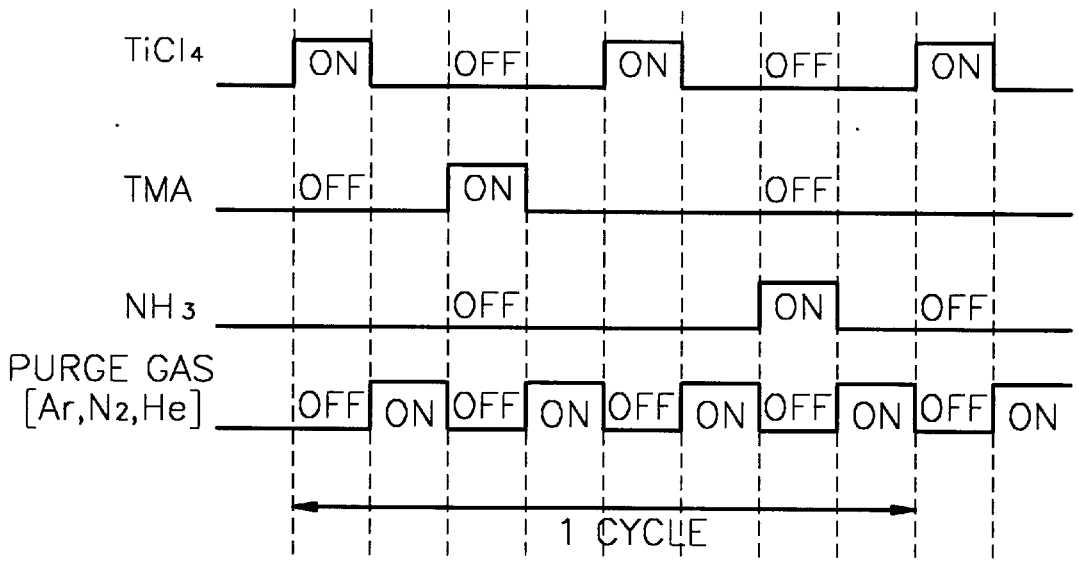

FIGS. 1A and 1B are graphs for showing an example of a method of injecting source and purge gases for deposition of an atomic layer when a metal layer is formed according to a first aspect of the present invention. Referring to FIGS. 1A and 1B, TiCl$_4$, TMA and NH$_3$ is repeatedly injected in a cycle of TiCl$_4$-TMA-TiCl$_4$—NH$_3$, thereby forming a TiAlN layer containing an abundance of Ti. It is preferable that the temperature of a substrate is 300–700° C., the inner pressure of a chamber is 0.1–10 torr, and a pulse-on time for which a source gas is injected is 0.1–10 seconds.

FIG. 1A shows a case in which purge operation is performed by continuously injecting a purge gas while the source gases are being injected. FIG. 1B shows a case in which purge operation is performed by injecting a purge gas in the form of a pulse between the injection pulses of the source gases. One among Ar, N$_2$ and He gases is used for the purge gas.

Figure 2A:
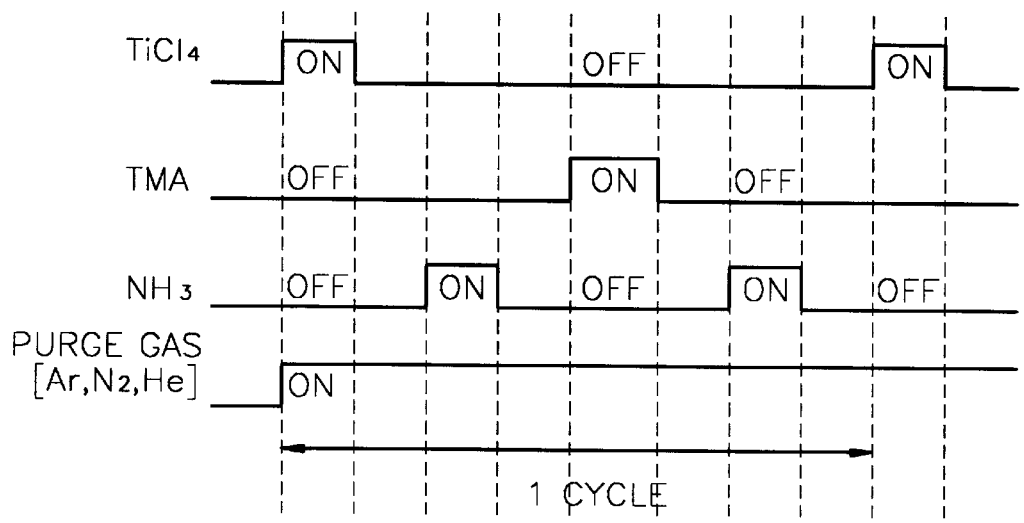
FIGS. 2A and 2B are graphs for showing another example of a method of injecting source and purge gases for deposition of an atomic layer when a metal layer is formed according to a first aspect of the present invention.
Figure 2B:
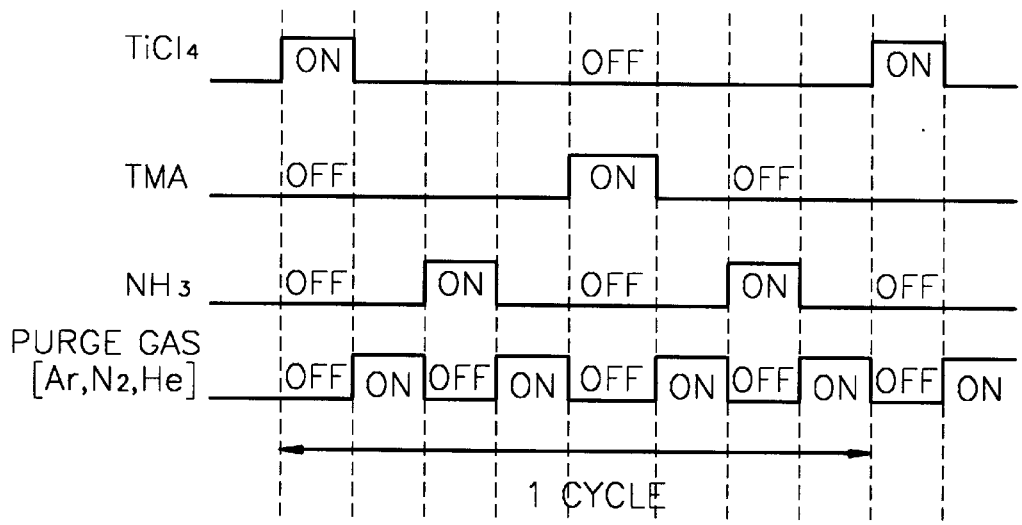

FIGS. 2A and 2B are graphs for showing another example of a method of injecting source and a purge gas for deposition of an atomic layer when a metal layer is formed according to a first aspect of the present invention. Referring to FIGS. 2A and 2B, TiCl$_4$, TMA and NH$_3$ is repeatedly injected in a cycle of TiCl$_4$—NH$_3$—TMA—NH$_3$, and a pulse-on time of TMA is longer than that of TiCl$_4$, thereby forming a TiAlN layer containing an abundance of Al. The conditions of a chamber is the same as those in FIGS. 1A and 1B. In other words, the temperature of a substrate is 300–700° C., the inner pressure of a chamber is 0.1–10 torr, and a pulse-on time for which a source gas is injected is 0.1–10 seconds.

FIG. 2A shows a case in which purge operation is performed by continuously injecting a purge gas while the source gases are being injected. FIG. 1B shows a case in which purge operation is performed by injecting a purge gas between the injection pulses of the source gases. One among Ar, N$_2$ and He gases is used for the purge gas.

The deposition ratio of each atomic layer can be appropriately adjusted by appropriately adjusting the number of injections of each source gas using the above methods. The electrical conductivity and resistance of each atomic layer vary depending on the deposition ratio of each atomic layer as shown in Table 1.

TABLE 1

| | Sample 1 | Sample 2 | Sample 3 |
|---|---|---|---|
| Ti | 35% | 24% | 21% |
| Al | 15% | 26% | 31% |
| N | 30% | 35% | 35% |
| C | 17% | 10% | 8% |
| Cl | 3% | 3% | 3% |
| Ti:AL | 1:0.43 | 1:1.1 | 1:1.48 |
| Specific resistance ρ (µΩ-cm) | 589 | 3701 | 9161 |

Referring to Table 1, it can be seen that the specific resistance of the TiAlN layer increases as the content of Al with respect to the content of Ti increases in the composition of the TiAlN layer. Since a specific resistance ρ is proportional to the reciprocal of the electrical conductivity, the electrical conductivity decreases as the specific resistance increases. Accordingly, the TiAlN layer can be properly formed to have an electrical conductivity and a resistance proper to the usage thereof.

Figure 3:
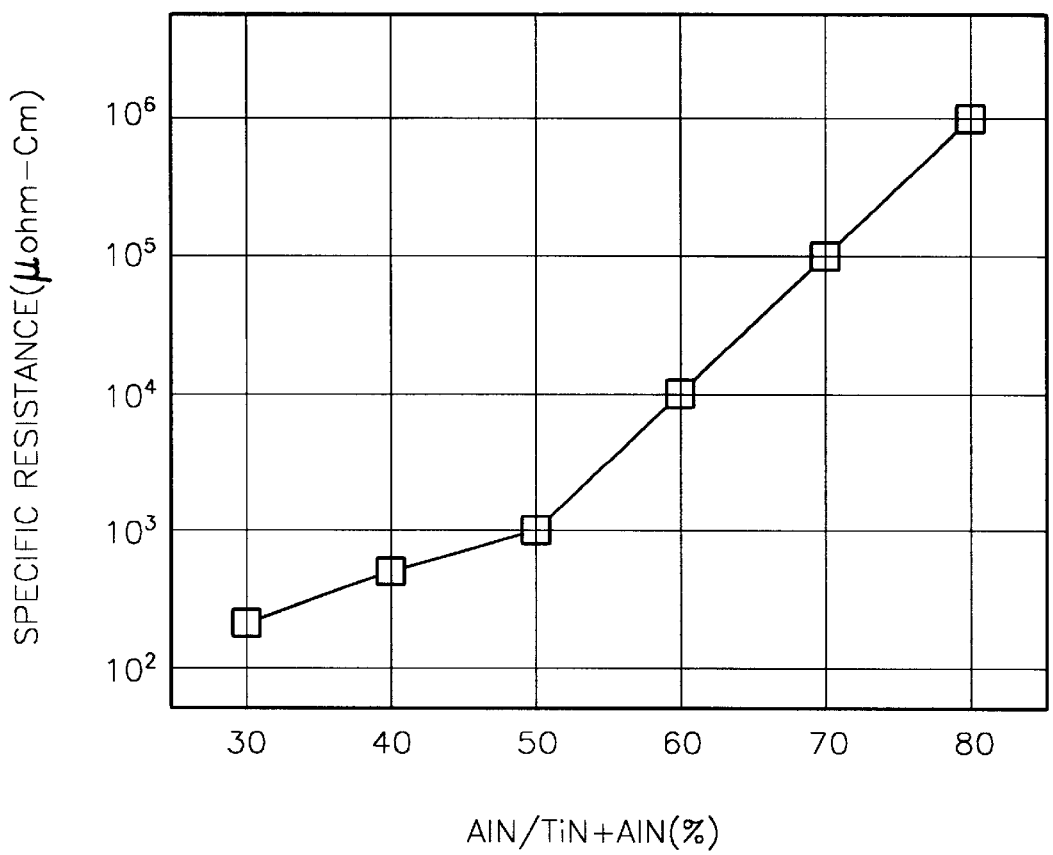
FIG. 3 is a graph for showing changes in the specific resistance of a titanium aluminum nitride (TiAlN) layer as the composition ratio of Al increases.

FIG. 3 is a graph showing change in specific resistance of a TiAlN layer as the ratio of AlN to TiN+AlN increases in the composition of the TiAlN layer. Referring to FIG. 3, it can be seen that the specific resistance of the TiAlN layer increases as the content of Al increases in the composition of the TiAlN layer. When the TiAlN layer is used as a upper electrode or a barrier metal layer between a polysilicon layer and the lower electrode of a capacitor, the specific resistance may vary according to the pattern of a device, but preferably is 300–10000 $\mu\Omega$-cm. Accordingly, the content of Al with respect to the content of Ti is preferably 10–35% in the TiAlN layer.

Figure 4:
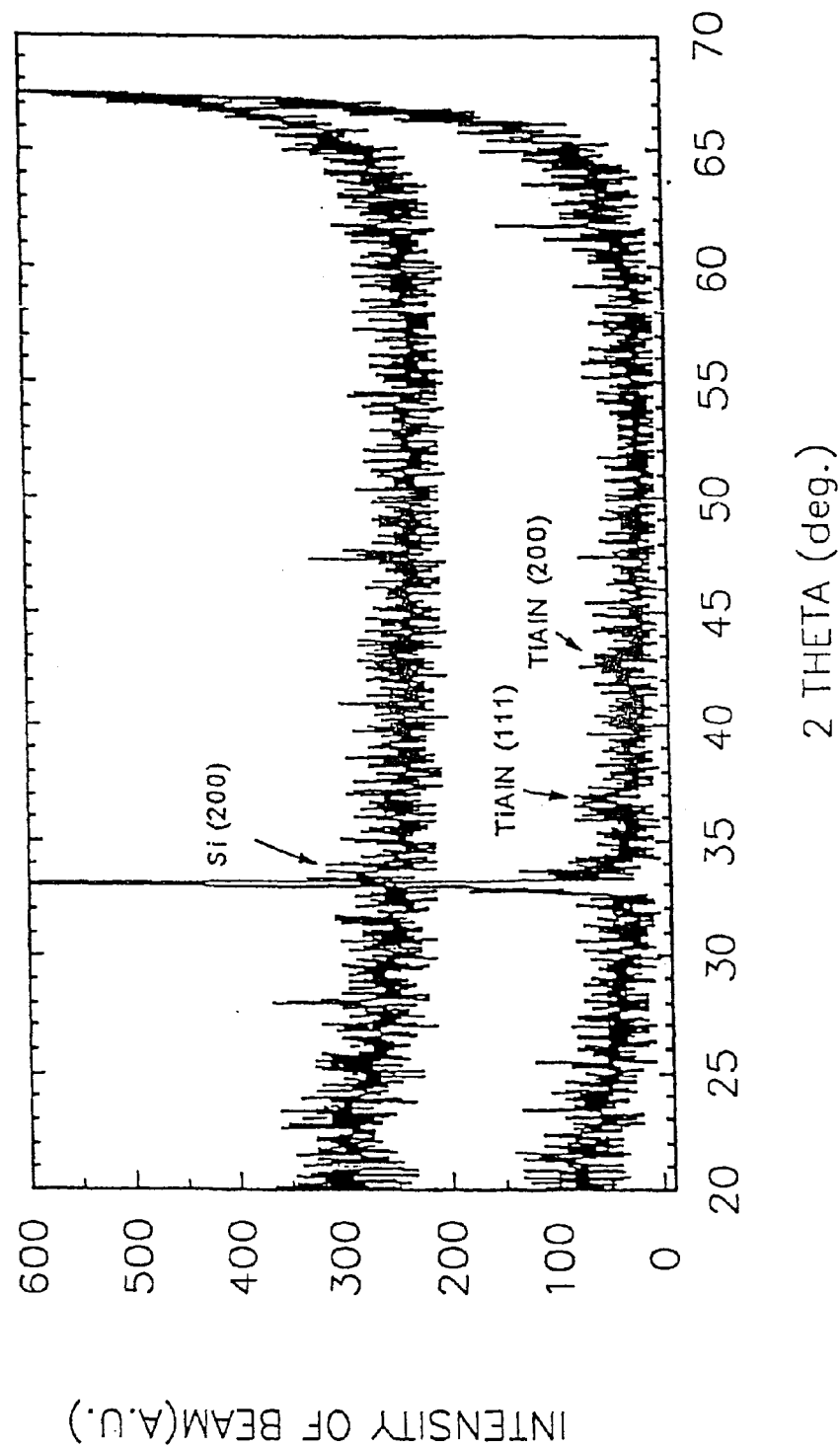
FIG. 4 is a graph for showing an XRD result of a TiAlN layer formed according to the present invention.
Figure 5A:
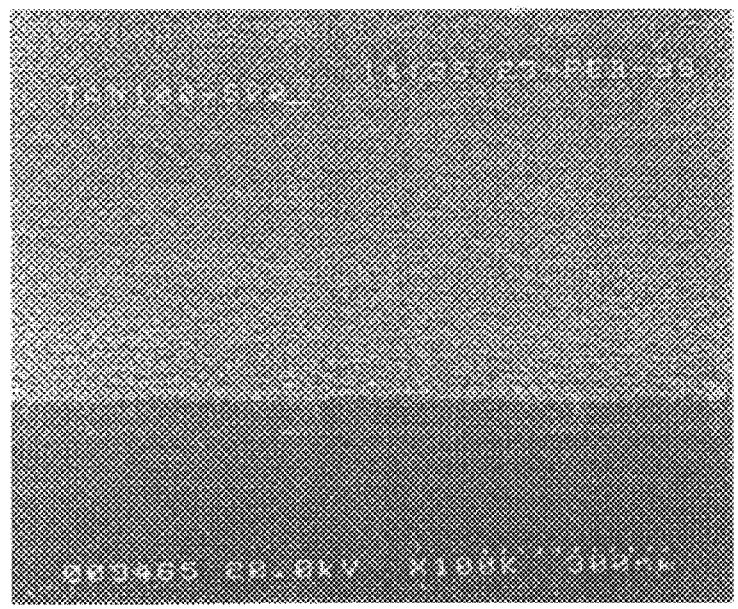
FIG. 5 is SEM photographs showing the surfaces of a conventional titanium nitride (TiN) film and a TiAlN layer according to the present invention.
Figure 5B:
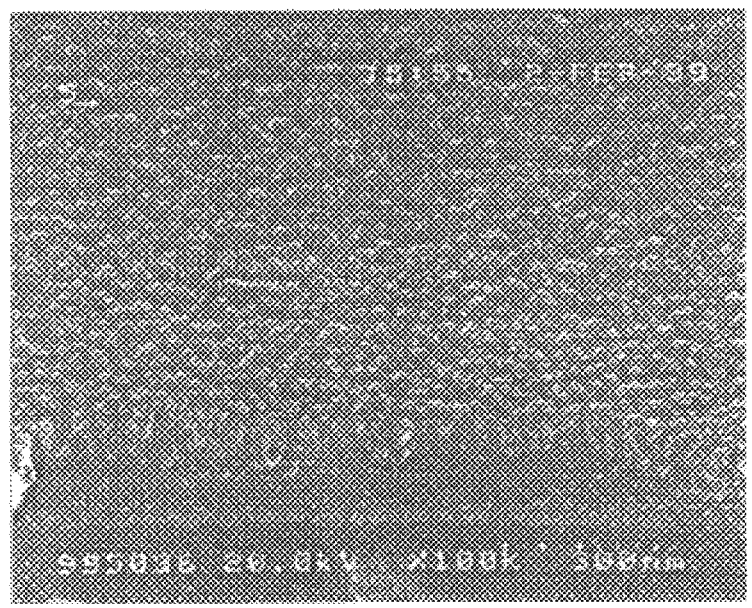

FIG. 4 is a graph for showing an XRD result of a TiAlN layer formed according to the present invention. FIG. 5 is SEM photographs showing surfaces of a conventional titanium nitride (TiN) layer and a TiAlN layer according to the present invention. More specifically, the upper graph of FIG. 4 is the XRD result of a TiAlN layer containing an abundance of Ti, and the lower graph is the XRD result of a TiAlN layer containing an abundance of Al. As shown in FIG. 4, it can be seen that a TiAlN layer formed according to the first aspect of the present invention is in an amorphous state as a whole even though slight TiAlN peaks are observed. As shown in FIG. 5, a TiAlN layer of the present invention has a much more planar surface than a conventional TiN layer.

Figure 6:
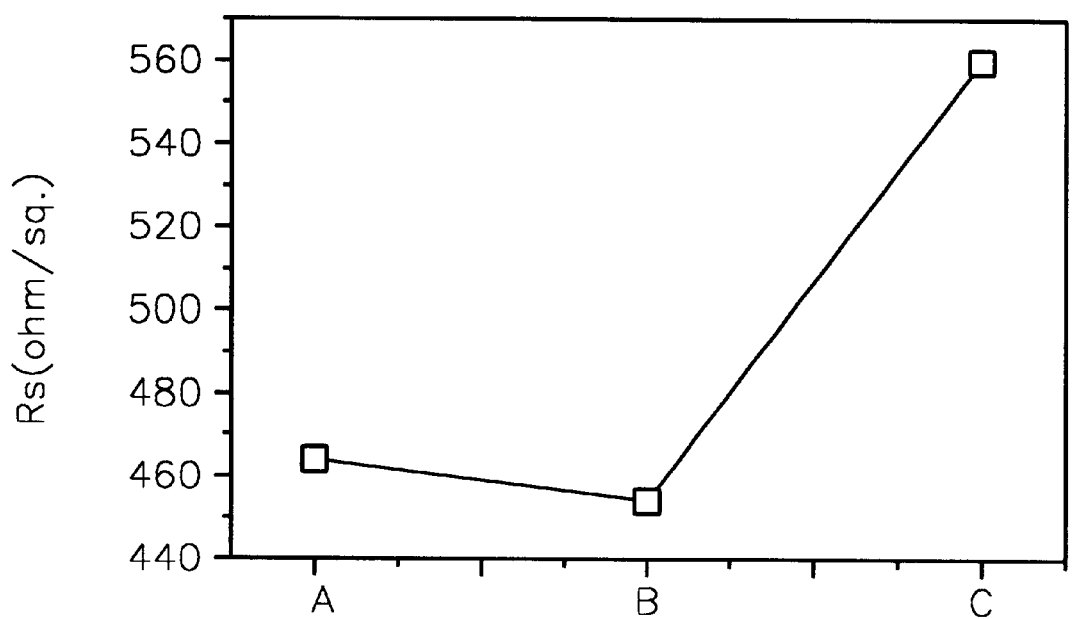
FIG. 6 is a graph showing changes in surface resistance (Rs) of a TiAlN layer which is thermal-processed in an oxygen atmosphere to test the thermal resistant and the oxidation resistant characteristics of a TiAlN layer of the present invention.

FIG. 6 is a graph showing changes in surface resistance (Rs) of a TiAlN layer which is thermal-processed in an oxygen atmosphere to test the thermal resistant and the oxidation resistant characteristics of a TiAlN layer of the present invention. In FIG. 6, a reference character "A" indicates a case in which no process is performed. "B" indicates a case in which a thermal process is performed at 0.1 torr and 600° C. in an $O_2$ atmosphere for 30 minutes. "C" indicates a case in which a thermal process is performed at 0.1 torr and 700° C. in an $O_2$ atmosphere for 30 minutes. Referring to FIG. 6, the Rs ("B") of a TiAlN layer of 250 Å, which is thermal-processed at 0.1 torr and 600° C. in an oxygen atmosphere for 30 minutes, rarely changes compared to the Rs ("A") of a TiAlN on which no process is performed. Accordingly, it can be seen that the TiAlN has an excellent thermal and oxidation resistant characteristics. The TiAlN of the present invention shows excellent thermal and oxidation resistant characteristics because Al in the TiAlN layer transfers to the surface of the TiAlN layer during thermal processing thereby to form an oxide film, i.e., an $Al_2O_3$ film, on the surface of the TiAlN layer, and thus diffusion of oxygen is prevented.

As described above, a TiAlN layer shows high thermal and oxidation resistant characteristics, and has an excellent step coverage even in a very compact region since atomic layers are individually deposited. Since individual atomic layers are sequentially adsorbed and formed, the composition of the TiAlN layer can be adjusted more easily and the reproducibility of the composition is excellent compared to CVD.

A trench type capacitor having a metal layer, which is formed by atomic layer deposition as described above, as a barrier metal layer and a method for fabricating the capacitor will be described in detail in a first embodiment. A cylinder type capacitor having the metal layer as an upper electrode and a method for fabricating the capacitor will be described in detail in a second embodiment. A trench type capacitor having the metal layer as a lower electrode and a method for fabricating the capacitor will be described in detail in a third embodiment.

First Embodiment

Figure 7A:
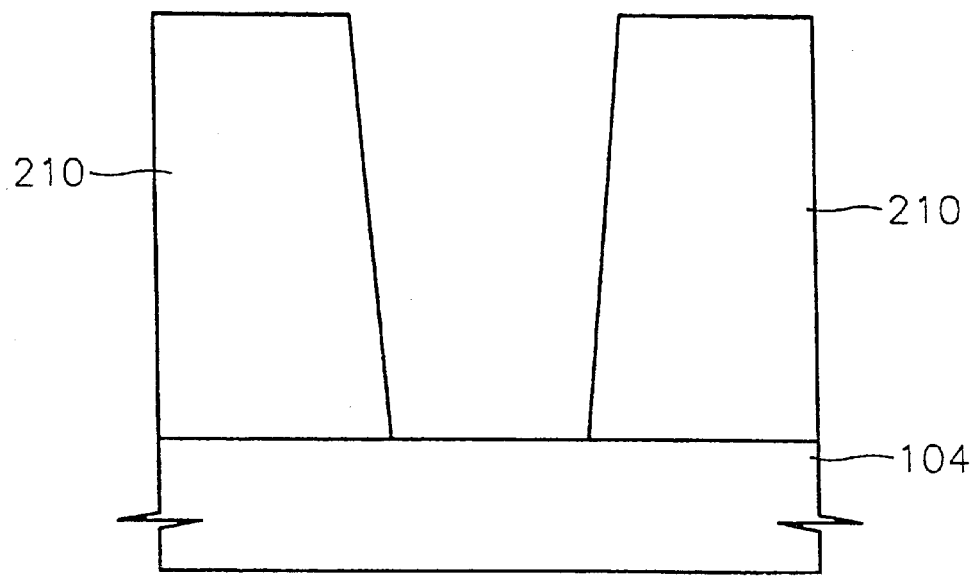
FIGS. 7A through 7D are sectional views for explaining a method of fabricating a semiconductor device employing a metal layer as a barrier metal layer according to an embodiment of the present invention.

Referring to FIG. 7A, an insulating layer 210 composed of a silicon oxide ($SiO_2$) film is formed on a semiconductor substrate 104. Subsequently, the insulating layer 210 is photo-etched to form a contact hole.

Figure 7B:
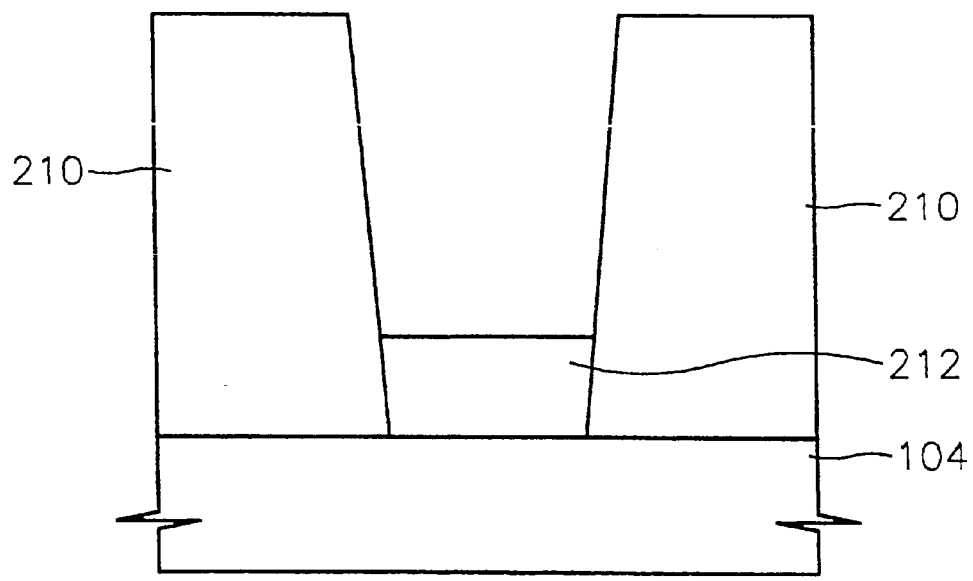

Referring to FIG. 7B, the contact hole may be partially filled to a predetermined depth or not filled at all to give a desired capacitance. When partially filling the contact hole, the contact hole is filled with polysilicon and then wet etching or wet etching combined with chemical mechanical polishing is performed on the polysilicon to leave a polysilicon film 212 of a predetermined thickness at the bottom of the contact hole.

Figure 7C:
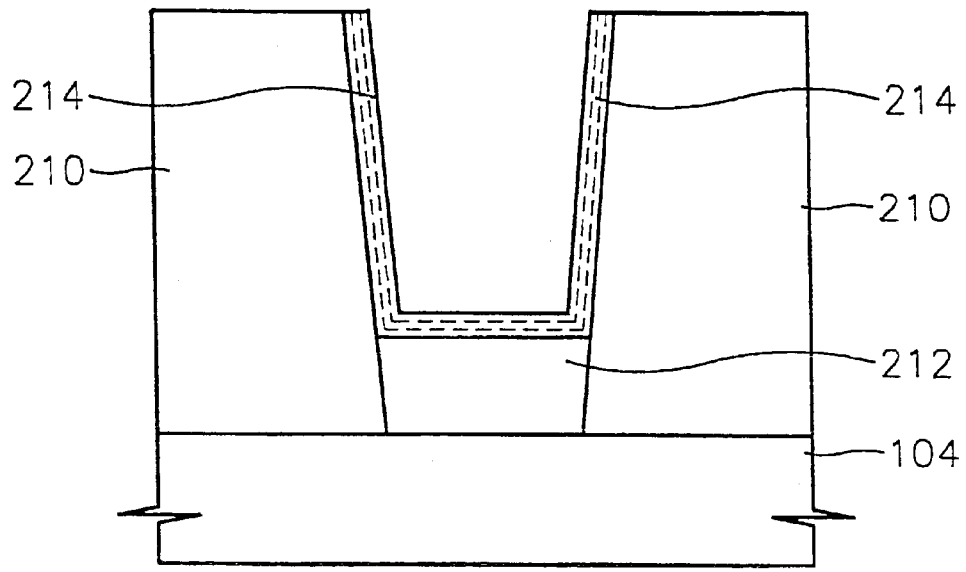

Referring to FIG. 7C, a barrier metal layer 214, which is improved in thermal and oxidation resistant characteristics, is formed on the insulating layer 210 and on the polysilicon film 212. The barrier metal layer 214 is a conductive layer in which the atomic layers of a reactive metal (A), an amorphous combination element (B) for preventing crystallization of the reactive metal and nitrogen (N), and nitrogen (N) are sequentially stacked by atomic layer deposition. For the reactive metal (A), Ti, Ta, W, Zr, Hf, Mo or Nb is used, and for the amorphous combination element (B), Al, Si or B is used. The amorphous combination element prevents the combination of the reactive metal and the nitrogen, thereby forming the barrier metal layer having an amorphous structure.

For example, for the barrier metal layer, pulsed injections of the source gases $TiCl_4$, TMA and $NH_3$ of a reactive metal (Ti), an amorphous combination element (Al) and nitrogen (N), respectively, are supplied, and the source gases are chemically adsorbed to the polysilicon film 212, thereby forming a TiAlN layer composed of a plurality of atomic layers. The TiAlN layer has a structure in which atomic layers corresponding to the source gases are alternately stacked since the source gases are alternately and individually supplied in a predetermined order. The TiAlN layer shows excellent thermal and oxidation resistant characteristics as described above. The ratios of the contents of Ti, Al and N constituting the barrier metal layer 214 to the total content of the barrier metal layer 214 are determined by the total number of injection pulses of the corresponding source gases. By appropriately determining the composition ratios, desirable electrical conductivity and resistance can be accurately obtained.

For the adjustment of composition, examples described above with reference to FIGS. 1A through 2B can be adopted, and the same conditions as described in the examples can be adopted in the deposition of atomic layers. Purge operation may be performed by continuously injecting a purge gas without interruption while the source gases are being injected as shown in FIGS. 1A and 2A. Alternatively, purge operation may be performed by injecting a purge gas between the injection pulses of the source gases as shown in FIGS. 1B and 2B. The purge gas is Ar, $N_2$, or He.

After forming the TiAlN layer on the polysilicon film 212 and the insulating layer 210, the portion of the TiAlN layer deposited outside of the contact hole is etched back and removed by wet etching or chemical mechanical polishing, thereby leaving only the portion of the barrier metal layer 214 formed in the contact hole. The barrier metal layer 214 formed using atomic layer deposition according to the present invention can be made to be thick in contrast to a conventional one. In addition, the thickness of the barrier metal layer 214 can be easily adjusted, and the composition of the barrier metal layer 214 can be easily and accurately adjusted. The specific resistance of the barrier metal layer 214 is preferably 300–10000 $\mu\Omega$-cm. Accordingly, the composition ratio of Al is adjusted such that the content of Al with respect to Ti is about 10–35% in the TiAlN layer.

Figure 7D:
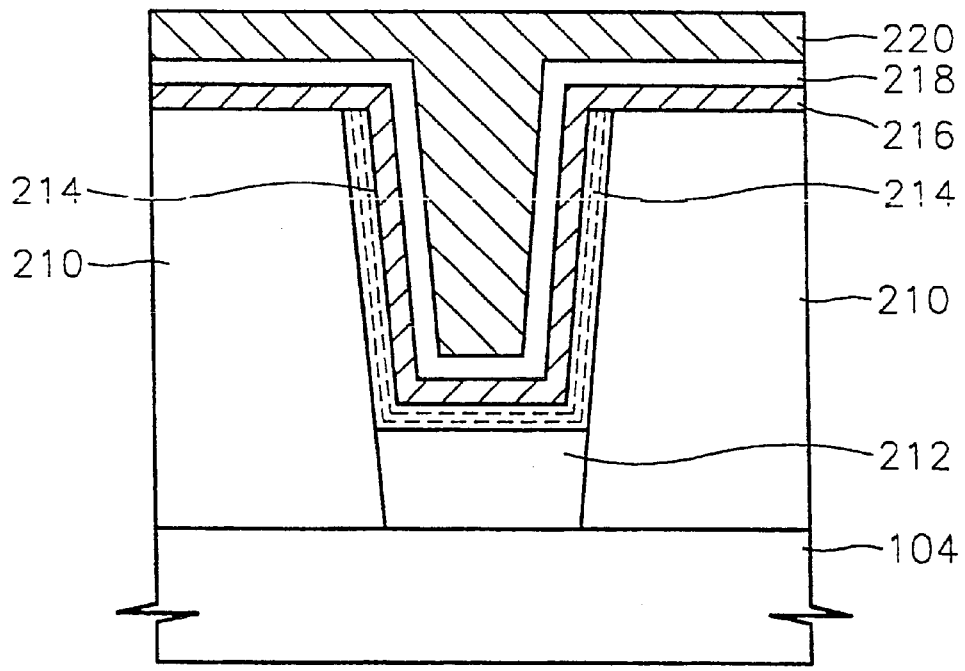

Referring to FIG. 7D, a trench type lower electrode 216 composed of a metal such as Cu, Al or W is formed on the resultant structure. The barrier metal layer 214 is particularly excellent in preventing diffusion when the lower electrode 216 is a metal which is easily diffused, such as Cu. Next, a tantalum oxide film ($Ta_2O_5$) or a ferroelectric substance, such as PZT ((Pb, Zr)$TiO_3$), BST ((Ba, Sr)$TiO_3$) or STO (Sr$TiO_3$), having a large dielectric constant is deposited on the trench type lower electrode layer 216 to form a dielectric film 218. Then, an upper electrode 220 is formed on the dielectric film 218.

Second Embodiment

Figure 8A:
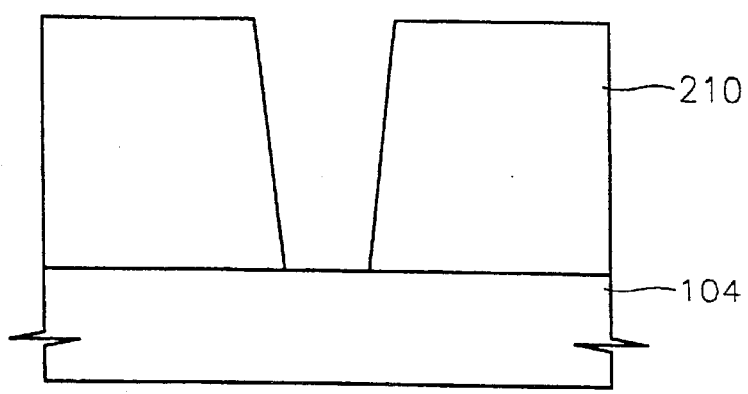
FIGS. 8A through 8E are sectional views for explaining a method of fabricating a semiconductor device employing a metal layer as the upper electrode of a capacitor according to the embodiment of the present invention.

With reference to FIGS. 8A through 8E, a cylinder type capacitor employing a metal layer formed by atomic layer deposition as an upper electrode will be described. Referring to FIG. 8A, an insulating layer 210 composed of a silicon oxide (Si$O_2$) film is formed on a semiconductor substrate 104. Subsequently, photo etching is performed to form a contact hole in the insulating layer 210.

Figure 8B:
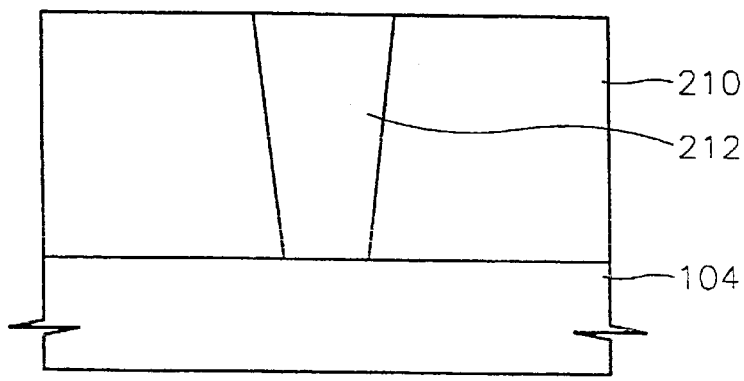

Referring to FIG. 8B, the contact hole is filled with a conductive material to form a plug 212. For example, the contact hole may be filled with doped polysilicon to form a poly plug.

Figure 8C:
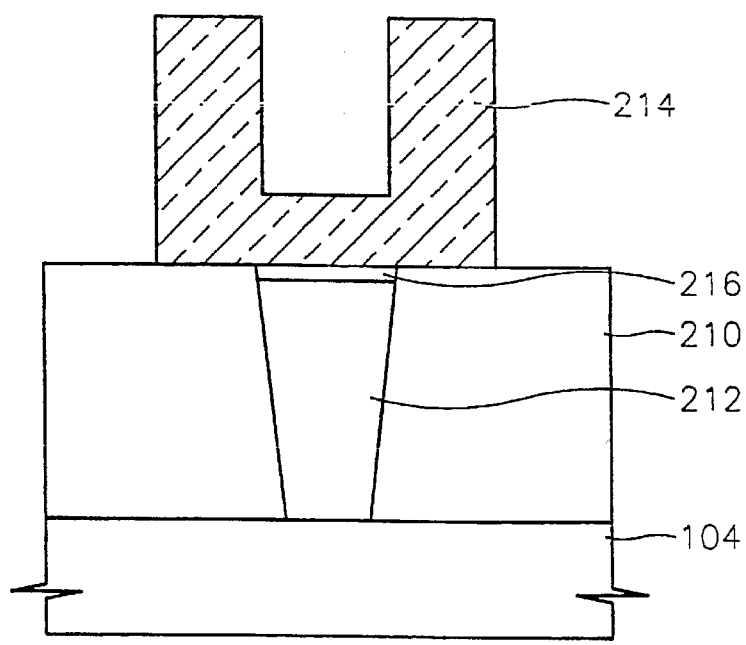

Referring to FIG. 8C, a cylinder type lower electrode 214 composed of a metal such as Al or W is formed on the insulating layer 210 and the plug 212 using a photoresist pattern (not shown). Next, a barrier metal layer 216 is formed of TiN or TaN between the cylinder type lower electrode 214 and the poly plug 212 to prevent oxidation of the poly plug 212 during a later thermal process. When the lower electrode 214 is a metal which is easily diffused, such as Cu, the barrier metal layer 216 is preferably composed of a metal layer of a ternary group, for example, a TiSiN layer, a TaSiN layer or a TiAlN layer, which is particularly excellent in preventing diffusion.

Figure 8D:
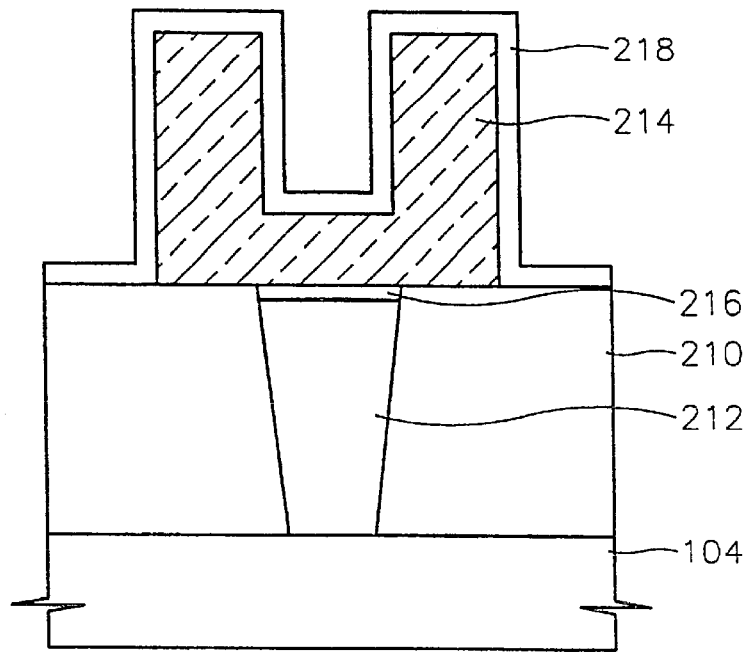

Referring to FIG. 8D, a tantalum oxide film ($Ta_2O_5$) having a large dielectric constant or a ferroelectric substance such as PZT ((Pb, Zr)$TiO_3$), BST ((Ba, Sr)$TiO_3$) or STO (Sr$TiO_3$), is deposited to form a dielectric film 218 surrounding the cylinder type lower electrode layer 214.

Figure 8E:
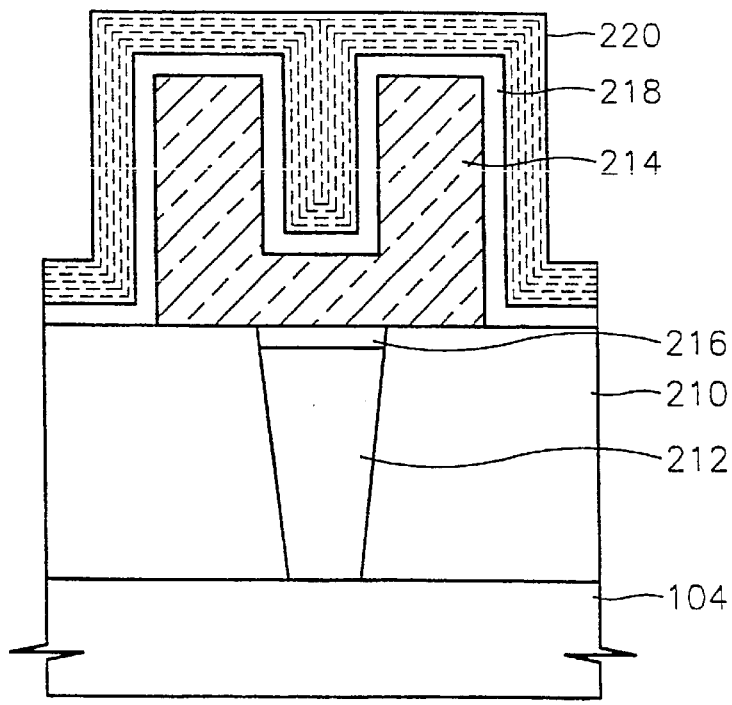

Referring to FIG. 8E, an upper electrode 220 having an A-B-N structure according to the present invention is formed on the dielectric film 218. The upper electrode 220 is a conductive layer in which atomic layers of a reactive metal (A), an amorphous combination element (B) for preventing crystallization of the reactive metal and nitrogen (N), and nitrogen (N) are sequentially stacked by atomic layer deposition. The composition ratio of an atomic layer of the upper electrode 220 is determined according to the number of injection pulses of the atomic layer to the total number of injection pulses used for the upper electrode 220, and the electrical conductivity and resistance of the upper electrode 220 can be appropriately determined by adjusting the ratio of the number of atomic layers formed of the amorphous combination element (B) to the combined number of other atomic layers. The reactive metal (A) may be Ti, Ta, W, Zr, Hf, Mo or Nb. The amorphous combination element (B) for preventing crystallization of the reactive metal (A) and the nitrogen (N) may be Al, Si or B.

In this embodiment, the upper electrode 220 is formed of a TiAlN layer. When forming the TiAlN layer, one among titanium chloride (Ti$Cl_4$), tetrakis demethyl amino titanium (TDMAT) and tetrakis deethyl amino titanium (TDEAT) is used as a source gas for Ti. One among trimethyl aluminum (TMA), triethyl aluminum (TEA), tri-I-buthyl aluminum (TIBA) and AlClx is used as a source gas for Al. One among $N_2$ and $NH_3$ is used as a source gas for N.

More specifically, in forming the upper electrode 220, pulsed injections of source gases for a nitrogen material of a ternary group are sequentially supplied into an atomic layer deposition chamber in a predetermined order thereby to sequentially stack atomic layers on the high dielectric film 218 on the semiconductor substrate 104.

To form a TiAlN layer as the upper electrode 220, pulsed injections of source gases Ti$Cl_4$, TMA and $NH_3$ of a reactive metal (Ti), an amorphous combination element (Al) and nitrogen (N), respectively, are supplied, and the source gases are chemically adsorbed to the high dielectric film 218, thereby forming a plurality of atomic layers. The upper electrode 220 has a structure in which atomic layers corresponding to each of the source gases are alternately stacked since the source gases are individually supplied. The ratios of the contents of Ti, Al and N constituting the upper electrode 220 to the total content of the upper electrode 220 are determined by appropriately adjusting the total number of injections of the corresponding source gases. By appropriately determining the composition ratios, desirable electrical conductivity and resistance can be accurately obtained.

For the adjustment of composition, examples described above with reference to FIGS. 1A through 2B can be adopted, and the same conditions as described in the examples can be adopted in the deposition of atomic layers. Purge operation may be performed by continuously injecting a purge gas without interruption while the source gases are being injected as shown in FIGS. 1A and 2A. Alternatively, purge operation may be performed by injecting a purge gas between the injection pulses of the source gases as shown in FIGS. 1B and 2B. The purge gas is Ar, $N_2$, or He.

Even when an upper electrode having a complex structure is deposited as in forming a cylinder type capacitor of this embodiment, the step coverage of the upper electrode formed according to the present invention is very good, thereby allowing fabrication of a capacitor having a high dielectric constant and excellent electrical reliability.

Since individual atomic layers are sequentially adsorbed and formed when forming an upper electrode in the embodiment as described above, the composition of the upper electrode can be adjusted more easily and the reproducibility of the composition is excellent compared to CVD. In other words, the composition of the upper electrode can be easily adjusted by adjusting only the pulsed injection order of source gases and the number of pulsed injections of each source gas for the upper electrode, so that the electrical conductivity and resistance of the upper electrode can be very easily adjusted as necessity requires. In addition, reproducibility of the composition is very excellent.

Third Embodiment

Figure 9A:
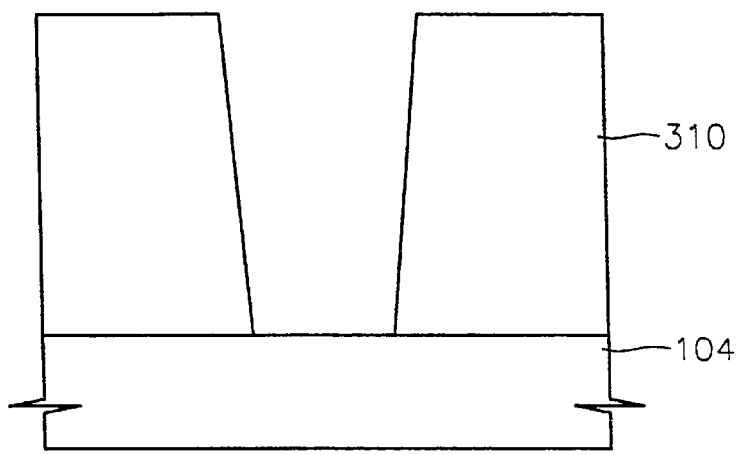
FIGS. 9A through 9E are sectional views for explaining a method of fabricating a semiconductor device employing a metal layer as the lower electrode of a capacitor according to an embodiment of the present invention.

With reference to FIGS. 9A through 9E, a trench type capacitor employing a metal layer formed by atomic layer deposition as a lower electrode will be described. Referring to FIG. 9A, an insulating layer 310 composed of a silicon oxide (Si$O_2$) film is formed on a semiconductor substrate 104. Subsequently, photo etching is performed to form a contact hole in the insulating layer 310.

Figure 9B:
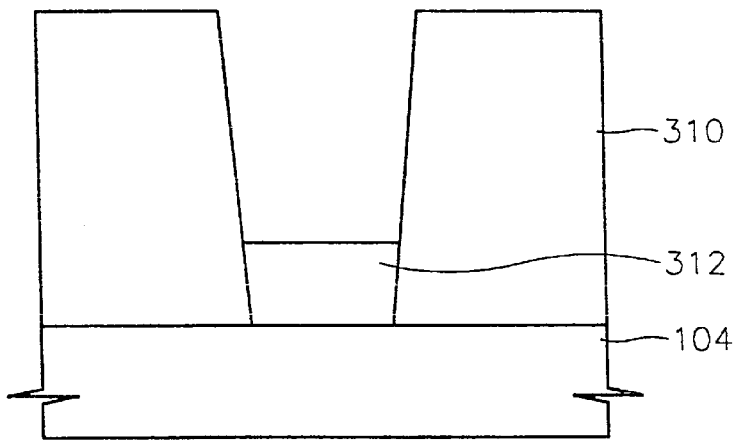

Referring to FIG. 9B, the contact hole may be partially filled to a predetermined depth or not filled at all to give a desired capacitance. When partially filling the contact hole, the contact hole is filled with polysilicon and then wet etching or wet etching combined with chemical mechanical polishing is performed on the polysilicon to leave a polysilicon film 312 of a predetermined thickness at the bottom of the contact hole.

Figure 9C:
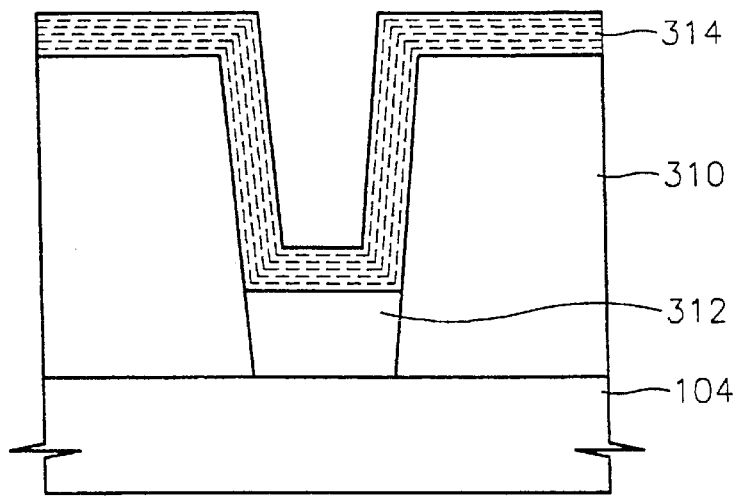

Referring to FIG. 9C, a lower electrode 314 is formed on the insulating layer 310 and on the polysilicon film 312. The lower electrode 314 is formed in a similar manner to that used in forming the upper electrode 220 in the second embodiment. In other words, the lower electrode 314 is a conductive layer in which a reactive metal (A), an amorphous combination element (B) for preventing crystallization of the reactive metal and nitrogen (N), and nitrogen (N) are alternately stacked by atomic layer deposition. The composition ratio of an atomic layer of the lower electrode 314 is determined according to the number of injection pulses of the atomic layer to the total number of injection pulses used for the lower electrode 314, and the electrical conductivity and resistance of the lower electrode 314 can be appropriately determined by adjusting the ratio of the number of atomic layers formed of the amorphous combination element (B) to the combined number of other atomic layers. The same materials as those used in the second embodiment are used for the reactive metal (A) and the amorphous combination element (B) for preventing crystallization of the reactive metal (A) and the nitrogen (N).

In this embodiment, the lower electrode 314 is formed of a TiAlN layer like the upper electrode 220 in the second embodiment. When forming the TiAlN layer, one among titanium chloride (TiCl$_4$), tetrakis demethyl amino titanium (TDMAT) and tetrakis deethyl amino titanium (TDEAT) is used as a source gas for Ti when forming a TiAlN layer. One among trimethyl aluminum (TMA), triethyl aluminum (TEA), tri-I-buthyl aluminum (TIBA) and AlClx is used as a source gas for Al. One among N$_2$ and NH$_3$ is used as a source gas for N.

The following description concerns a method of forming the lower electrode 314. The method of forming the lower electrode 314 is similar to the method of forming the upper electrode 220 in the second embodiment.

To form a TiAlN layer as the lower electrode 314, pulsed injections of source gases TiCl$_4$, TMA and NH$_3$ of a reactive metal (Ti), an amorphous combination element (Al) and nitrogen (N), respectively, are supplied, and the source gases are chemically adsorbed to the polysilicon film 312 and the insulating layer 310, thereby forming a plurality of atomic layers.

The lower electrode 314 has a structure in which atomic layers corresponding to the source gases are alternately stacked since the source gases are alternately supplied in a predetermined order. The composition ratios of Ti, Al and N constituting the lower electrode 314 are determined by appropriately adjusting the number of injections of each source gas. By appropriately determining the composition ratios, desirable electrical conductivity and resistance can be accurately obtained.

For the adjustment of composition, examples described above with reference to FIGS. 1A through 2B can be adopted, and the same conditions as described in the examples can be adopted in the deposition of atomic layers. Purge operation may be performed by continuously injecting a purge gas without interruption while the source gases are being injected as shown in FIGS. 1A and 2A. Alternatively, purge operation may be performed by injecting a purge gas between the injection pulses of the source gases as shown in FIGS. 1B and 2B. The purge gas is Ar, N$_2$, or He.

After depositing each atomic layer a predetermined number of times as described above, the lower electrode 314 of a desirable pattern is completed using a mask such as a photoresist pattern.

Figure 9D:
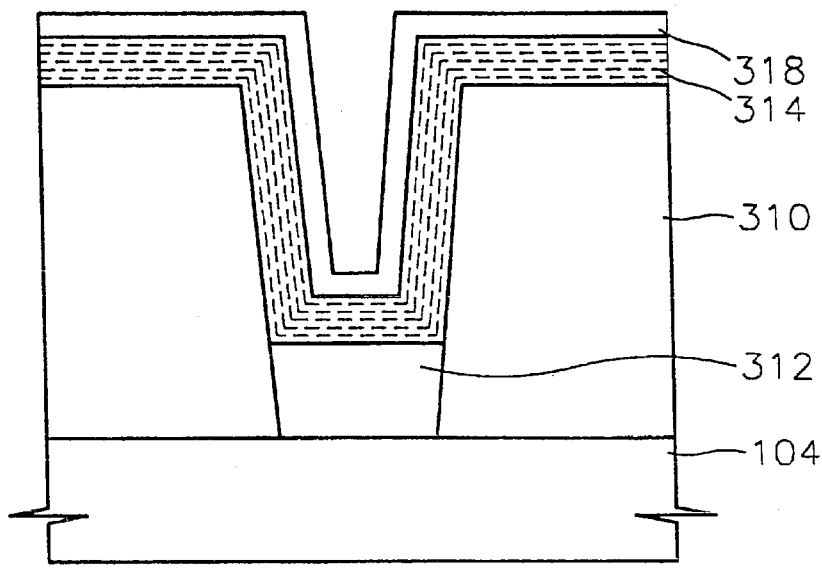

Referring to FIG. 9D, a tantalum oxide film (Ta$_2$O$_5$) having a large dielectric constant or a ferroelectric substance, such as PZT ((Pb, Zr)TiO$_3$), BST ((Ba, Sr)TiO$_3$) or STO (SrTiO$_3$), is deposited on the trench type lower electrode layer 314 to form a trench type dielectric film 318.

Figure 9E:
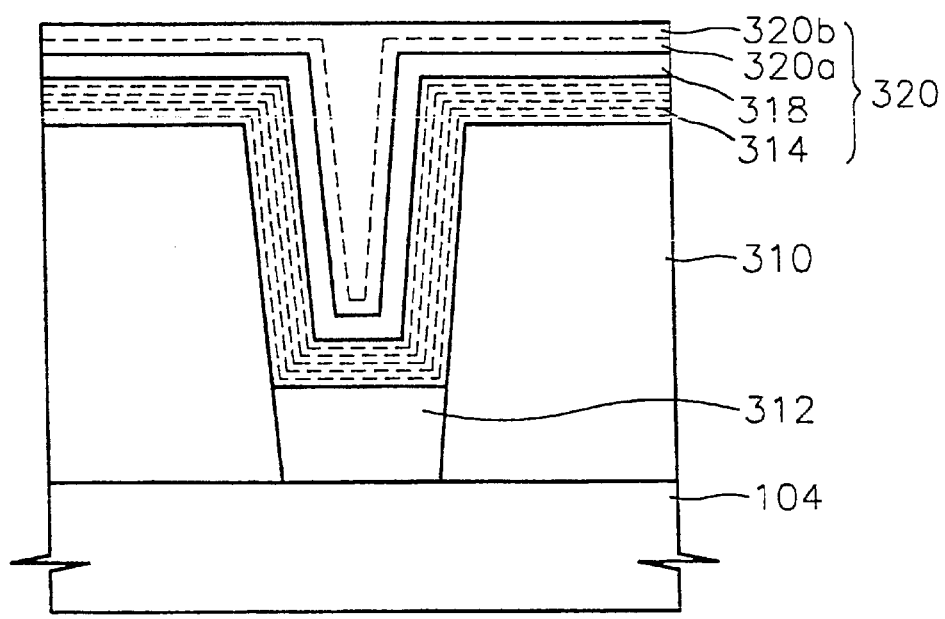

Referring to FIG. 9E, an upper electrode 320 is formed on the high dielectric film 318. To prevent oxidation caused by the underlying high dielectric film 318 during a thermal process, the upper electrode 320 is formed such that a metal layer 320a acting as a barrier layer is formed of TiN or TaN on the high dielectric film 318 and a polysilicon layer 320b is formed on the metal layer 320a. instead of using the metal layer 320a and the polysilicon layer 320b, the upper electrode 320 may be formed of a metal layer, which is composed of a reactive metal (A), an amorphous combination element (B) for preventing crystallization of the reactive metal (A) and nitrogen (N), and nitrogen (N), for example, a TiAlN layer. To achieve excellent step coverage of the trench type high dielectric film 318, the upper electrode 320 is preferably formed by atomic layer deposition in the same manner as used in forming the lower electrode 314.

When the lower electrode 314 is formed of a TiAlN layer formed by atomic layer deposition as described above, the lower electrode 314 successfully functions as a barrier metal layer since the TiAlN layer has excellent thermal and oxidation resistant characteristics. Accordingly, an additional barrier layer does not need to be formed between the lower electrode 314 and the underlying polysilicon film 312 or the semiconductor substrate 104, which comes in contact with the lower electrode 314, thereby simplifying fabrication.

Since atomic layers are individually deposited in forming the lower electrode 314, the step coverage of the lower electrode 314 is excellent even in a very compact region. Even when a lower electrode having a complex structure and high aspect ratio is deposited in forming a trench type capacitor of this embodiment, the step coverage of the lower electrode formed according to the present invention is very good, thereby allowing fabrication of a capacitor having a high dielectric constant and excellent electrical reliability.

Since individual atomic layers are sequentially adsorbed and formed when forming a lower electrode in this embodiment as described above, the composition of the lower electrode can be adjusted more easily and the reproducibility of the composition is excellent compared to CVD. In other words, the composition of the lower electrode can be easily adjusted by adjusting only the pulse injection order of source gases and the number of injections of each source gas for the lower electrode, so that the electrical conductivity and resistance of the lower electrode can be very easily adjusted as necessity requires. In addition, reproducibility of the composition is very excellent.

Figure 10:
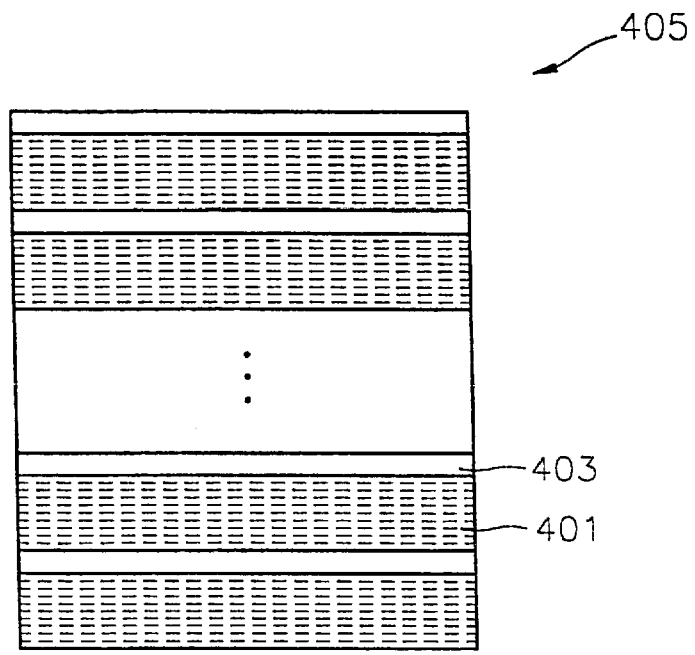
FIG. 10 is a sectional view for explaining a method of forming a metal layer using atomic layer deposition according to a second aspect of the present invention.

Method for Forming Metal Layer Using Atomic Layer Deposition According to Second Aspect of the Present Invention FIG. 10 is a sectional view for explaining a method of forming a metal layer using atomic layer deposition according to a second aspect of the present invention.

Figure 11:
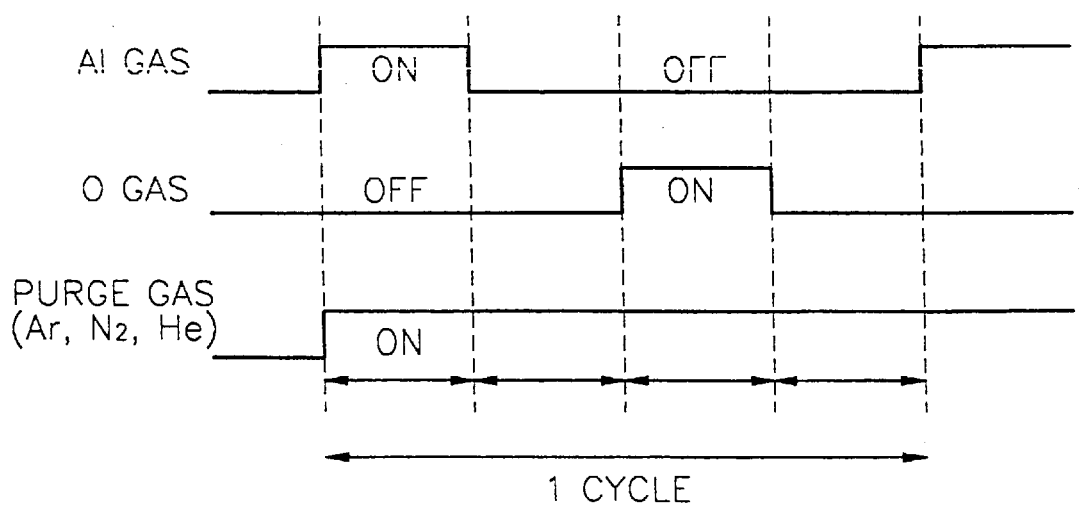
FIG. 11 is a graph for showing an example of a method of injecting source and purge gases for deposition of an atomic layer when forming the oxygen diffusion preventing layer of FIG. 10.

FIG. 11 is a graph for showing an example of a method of injecting source and purge gases for deposition of an atomic layer when forming the oxygen diffusion preventing layer of FIG. 10.

Referring to FIG. 10, a metal layer formed by atomic layer deposition according to the second aspect of the present invention is a multiple metal layer 405. The multiple metal layer 405 is formed by depositing a plurality of metal layers 401 in alternation with a plurality of oxygen diffusion preventing layers 403. The metal layer 401 and the oxygen diffusion preventing layer 403 are formed in situ using atomic layer deposition equipment. The oxygen diffusion preventing layer 403 is formed thinly, for example, to a thickness of 5–15 Å, not to interfere with the flow of electrons.

The metal layer 401 is formed in the same manner as used in forming a metal layer of the first aspect. In other words, the metal layer 401 is formed in a structure in which a reactive metal (A), an amorphous combination element (B) for preventing crystallization of the reactive metal and nitrogen (N), and nitrogen (N) are alternately stacked in an A-B-N structure by atomic layer deposition. More specifically, pulsed injections of source gases for a reactive metal (A), an amorphous combination element (B) for preventing crystallization of the reactive metal (A) and nitrogen (N), and nitrogen (N) are alternately applied to a semiconductor substrate (not shown) in a predetermined order. The source gases are sequentially and chemically adsorbed to the semiconductor substrate, thereby forming an A-B-N structure. The number of injections of each source gas is adjusted to obtain a desirable composition of the metal layer 401.

The reactive metal (A) may be Ti, Ta, W, Zr, Hf, Mo or Nb, and the amorphous combination element (B) may be Ai; Si or B. The metal layer 401 is formed under the same conditions (e.g., deposition temperature and source gases) as those of the method of forming a metal layer according to the first aspect of the present invention. The metal layer 401 is a TiAlN layer.

Next, the oxygen diffusion preventing layer 403 is formed on the metal layer 401 using atomic layer deposition. The oxygen diffusion preventing layer 403 prevents permeation of oxygen diffused from the outside. The oxygen diffusion preventing layer 403 is formed by alternately applying pulsed injections of a metal element, for example, an aluminum source gas, and an oxygen gas to the metal layer 401 as shown in FIG. 11. In this aspect, the oxygen diffusion preventing layer 403 is formed of an aluminum oxide film. In forming the aluminum oxide film, one among trimethyl aluminum (TMA), triethyl aluminum (TEA), tri-I-buthyl aluminum (TIBA) or AlClx is used as an aluminum source gas. One among $O_2$ and $N_2O$ is used as an oxygen source gas. One among argon gas, nitrogen gas and helium gas is used as a purge gas.

The thermal and oxidation resistant characteristics of the multiple metal layer 405 can be outstandingly improved since the oxygen diffusion preventing layer 403 is additionally formed on the metal layer 401 (between the metal layers 401) which has good thermal and oxidation resistant characteristics as described in the first aspect of the present invention. While a metal layer according to the first aspect has an oxide layer on the surface thereof, the multiple metal layer 405 according to the second aspect has the oxygen diffusion preventing layers 403 therewithin and on the surface thereof, thereby more reliably preventing diffusion of oxygen.

Figure 12:
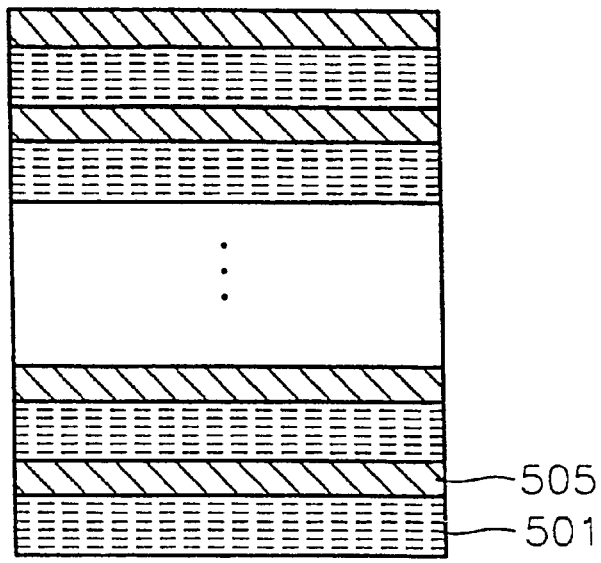
FIGS. 12 and 13 are sectional views for explaining a method of forming a metal layer using atomic layer deposition according to a third aspect of the present invention.
Figure 13:
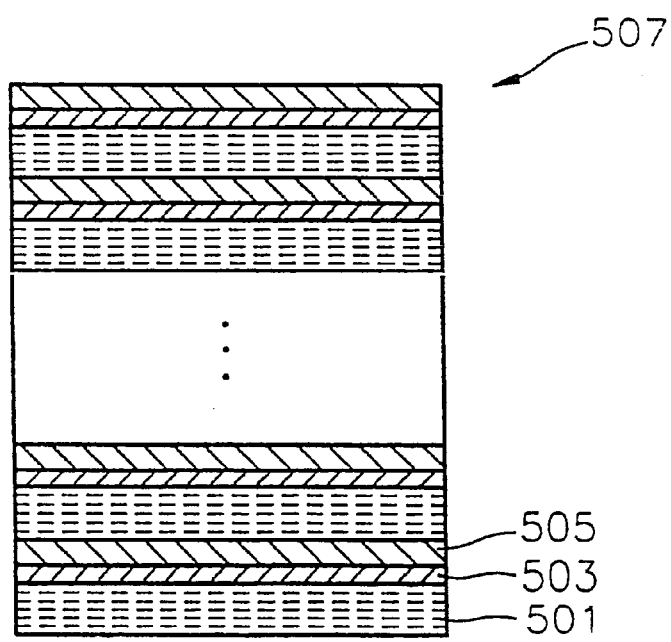

Method for Forming Metal Layer Using Atomic Layer Deposition According to Third Aspect of the Present Invention FIGS. 12 and 13 are sectional views for explaining a method of forming a metal layer using atomic layer deposition according to a third aspect of the present invention. A metal layer formed by atomic layer deposition according to the third aspect of the present invention is a multiple metal layer 507 as shown in FIG. 13. The multiple metal layer 507 is formed by sequentially depositing a metal layer 501, an oxygen diffusion preventing layer 503 and a material layer 505 multiple times. The oxygen diffusion preventing layer 503 is spontaneously formed by a thermal process as will later be described.

Referring to FIG. 12, the metal layer 501 is formed on a semiconductor substrate (not shown). The metal layer 501 is formed in the same manner as used in forming a metal layer of the first aspect of the present invention. In other words, the metal layer 501 is formed in a structure in which a reactive metal (A), an amorphous combination element (B) for preventing crystallization of the reactive metal and nitrogen (N), and nitrogen (N) are sequentially stacked in an A-B-N structure by atomic layer deposition. The reactive metal (A) may be Ti, Ta, W, Zr, Hf, Mo or Nb, and the amorphous combination element (B) may be Al, Si or B as in the first aspect of the present invention. The metal layer 501 is formed under the same conditions (e.g., deposition temperature and source gases) as those of the method of forming a metal layer according to the first or second aspect of the present invention. The metal layer 501 is a TiAlN layer.

Next, the material layer 505 containing oxygen is formed on the metal layer 501 using atomic layer deposition. In this aspect of the present invention, the material layer 505 is formed of a TiON film. In other words, pulsed injections of titanium, oxygen and nitrogen source gases are alternately supplied to an atomic layer deposition chamber in a predetermined order, thereby forming the TiON film.

Referring to FIG. 13, a thermal process is performed on the semiconductor substrate including the metal layer 501 and the material layer 505 to thereby form the oxygen diffusion preventing layer 503 between the metal layer 501 and the material layer 505. The metal substance of the metal layer 501 reacts with the oxygen of the material layer 505, thereby forming the oxygen diffusion preventing layer 503. For example, when the metal layer 501 is formed of a TiAlN film and the material layer 505 is formed of a TiON film, the aluminum in the metal layer 501 drifts to the surface of the metal layer 501 and reacts with the oxygen contained in the material layer 505, thereby forming the oxygen diffusion preventing layer 503 of an aluminum oxide film. The multiple metal layer 507 according to the third aspect includes a plurality of structures, each of which is composed of the metal layer 501, the oxygen diffusion preventing layer 503 and the material layer 505 which are sequentially stacked.

The thermal and oxidation resistant characteristics of the multiple metal layer 507 can be outstandingly improved since the oxygen diffusion preventing layer 503 is additionally formed on the metal layer 501 (between the metal layers 501) having good thermal and oxidation resistant characteristics as described in the first aspect of the present invention.

Figure 14:
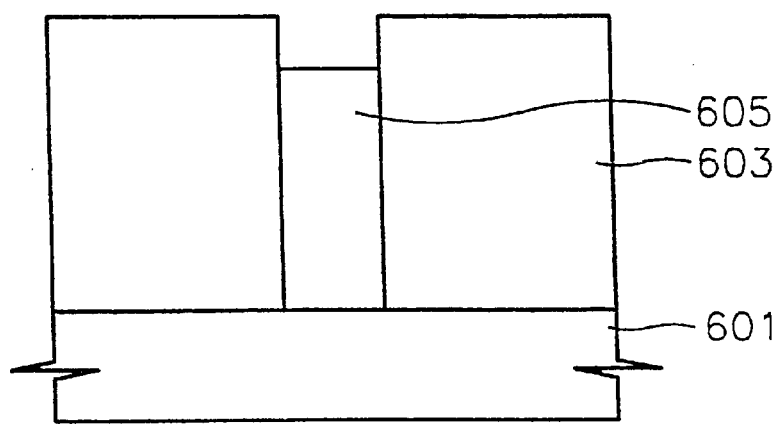
FIGS. 14 and 15 are sectional views for explaining a method of fabricating a semiconductor device employing a metal layer, which is formed by atomic layer deposition according to the second and third aspects of the present invention, as a barrier metal layer.
Figure 15:
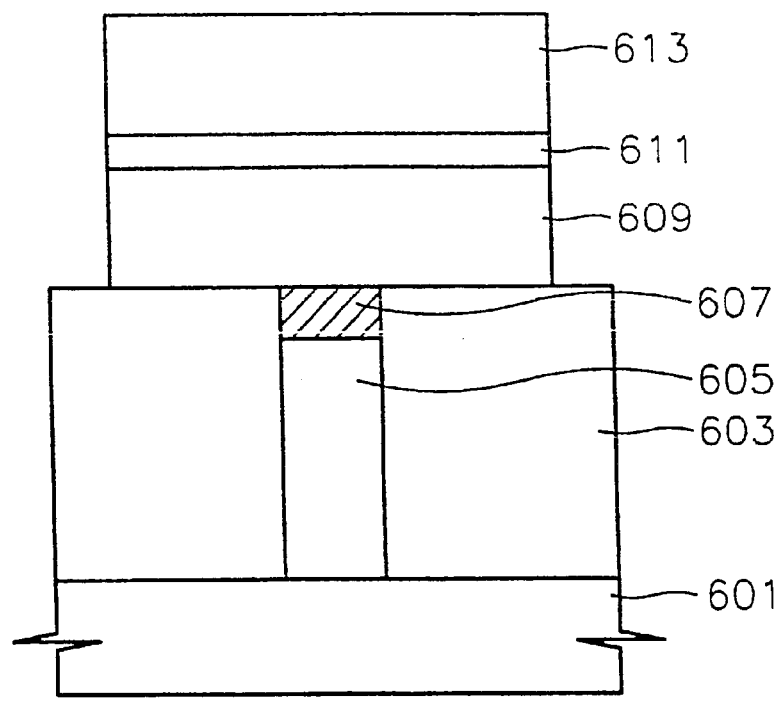

With reference to FIGS. 14 and 15, a method for fabricating a semiconductor device employing a metal layer, which is formed by atomic layer deposition according to the second and third aspects of the present invention, as a barrier metal layer will be described in detail. Referring to FIG. 14, an insulating layer 603 composed of a silicon oxide (SiO$_2$) film is formed on a semiconductor substrate 601. Subsequently, photo etching is performed to form a contact hole in the insulating layer 603. Next, the contact hole is filled with a polysilicon film to a predetermined height to form a plug 605 which is a conductive material film. The plug 605 is formed by depositing polysilicon over the insulating layer 603 and in the contact hole and then performing wet etching or wet etching combined with chemical mechanical polishing on the polysilicon to leave the polysilicon of a predetermined thickness at the bottom of the contact hole.

Referring to FIG. 15, a metal layer is formed on the entire surface of the semiconductor substrate 601 including the plug 605. An etchback or chemical mechanical polishing process is performed on the metal layer to form a barrier metal layer 607 filling the contact hole. The barrier metal layer 607 is formed in the same manner as used in forming a metal layer according to the second or third aspect of the present invention. In other words, the barrier metal layer 607 may be a multiple metal layer which is formed by repeatedly, e.g., 3–10 times, stacking a two-layer structure in which a metal layer having a reactive metal (A)-amorphous combination element (B)-nitrogen (N) structure formed by atomic layer deposition and an oxygen diffusion preventing layer having a thickness of 5–15 Å are sequentially stacked. Alternately, the barrier metal layer 607 may be a multiple metal layer which is formed by repeatedly, e.g., 3–10 times, stacking a three-layer structure in which a metal layer having an A-B-N structure, an oxygen diffusion prevention layer and a material layer are sequentially stacked.

The reactive metal (A) may be Ti, Ta, W, Zr, Hf, Mo or Nb, and the amorphous combination element (B) may be Al, Si or B. In this embodiment, the barrier metal layer 607 is formed of a TiAlN layer to a thickness of 50–500 Å. When the barrier metal layer 607 is formed of a multiple metal layer, oxidation of the plug 605 can be more reliably prevented during a thermal process.

Next, a lower electrode 609 is formed on the semiconductor substrate 601 including the barrier metal layer 607. The lower electrode 609 is formed of platinum (Pt), ruthenium (Ru), iridium (Ir), ruthenium oxide (RuO$_2$) or iridium oxide (IrO$_2$). A tantalum oxide film (Ta$_2$O$_5$) or a ferroelectric substance, such as PZT ((Pb, Zr)TiO$_3$), BST ((Ba, Sr)TiO$_3$) or STO (SrTiO$_3$) having a large dielectric constant, is deposited on the lower electrode layer 609 to form a dielectric film 611. Then, an upper electrode 613 is formed on the dielectric film 611. The upper electrode 613 is formed of the same substance as the lower electrode 609.

As described above, a metal layer or a multiple metal layer formed by atomic layer deposition of the present invention has a high thermal and oxidation resistant characteristics. Since a metal layer of a multiple metal layer of the present invention is formed by individually depositing atomic layers, the step coverage thereof is excellent even in a very compact region. In addition, since individual atomic layers are adsorbed and formed in a predetermined order in atomic layer deposition of the present invention, the composition ratio of each element contained in the metal layer or the multiple metal layer can be easily adjusted, and the reproducibility of the composition is excellent as compared with CVD.

According to atomic layer deposition of the present invention, the composition ratio of each element of a metal layer or a multiple metal layer can be desirably adjusted only by appropriately determining the number of pulsed injections of a source gas. Accordingly, the resistance and electrical conductivity of the metal layer or the multiple metal layer can be very conveniently adjusted.

A metal layer or a multiple metal layer formed by atomic layer deposition of the present invention may be used as a barrier metal layer, a lower electrode or an upper electrode in a semiconductor device. When a metal layer or a multiple metal layer of the present invention is used as a barrier metal layer, oxidation of a polysilicon plug can be prevented in addition to the effects described above. When a metal layer or a multiple metal layer of the present invention is used as a lower electrode, an additional barrier metal layer does not need to be formed between the lower electrode and a substrate, thereby simplifying the fabrication. When a metal layer or a multiple metal layer of the present invention is used as an upper electrode, the composition of the upper electrode can be easily adjusted, thereby facilitating adjustment of the electrical conductivity and resistance.

What is claimed is:

1. A semiconductor device comprising:

an insulating film including a contact hole in a semiconductor substrate;

a conductive material film in the contact hole on the semiconductor substrate;

a capacitor comprising a lower electrode on the conductive material film in the contact hole, a high dielectric film on the lower electrode and an upper electrode on the high dielectric film; and a barrier metal layer between the conductive material film in the contact hole and the lower electrode, the barrier metal layer comprising an A-B-N structure of a layer of reactive metal (A) that is on a layer of an amorphous combination element (B) for preventing crystallization of the reactive metal (A) and nitrogen (N), and that is on a layer of nitrogen (N).

2. The semiconductor device of claim 1, wherein the reactive metal (A) is one selected from the group consisting of titanium (Ti), tantalum (Ta), tungsten (W), zirconium (Zr), hafnium (Hf), molybdenum (Mo) and niobium (Nb).

3. The semiconductor device of claim 1, wherein the amorphous combination element (B) for preventing crystallization of the reactive metal (A) and the nitrogen (N) is one selected from the group consisting of aluminum (Al), silicon (Si) and boron (B).

4. The semiconductor device of claim 1, wherein the electrical conductivity and resistance of the barrier metal layer is determined by the number of injection pulses of an atomic layer of an amorphous combination element to the total number of injection pulses used for the barrier metal layer.

5. The semiconductor device of claim 1, wherein the specific resistance of the barrier metal layer increases as the content of Al increases relative to the content of Ti in the barrier metal layer.

6. The semiconductor device of claim 1, wherein the content of Al with respect to the reactive metal is 10–35% when the barrier metal layer is formed of TiAlN.

7. The semiconductor device of claim 1, further comprising an oxygen diffusion preventing layer on the metal layer, wherein the barrier metal layer may be formed of a multiple metal layer comprising a plurality of metal layers and a plurality of oxygen diffusion preventing layers.

8. The semiconductor device of claim 7, further comprising a material layer containing oxygen on the oxygen diffusion preventing layer.

9. A semiconductor device having a capacitor comprising a lower electrode on a predetermined material film on a semiconductor substrate, a high dielectric film on the lower electrode and an upper electrode on the high dielectric film, wherein the lower electrode is an A-B-N structure of a layer of reactive metal (A) that is on a layer of an amorphous combination element (B) for preventing crystallization of the reactive metal (A) and nitrogen (N), and that is on a layer of nitrogen(N).

10. The semiconductor device of claim 9, wherein the reactive metal (A) is one selected from the group consisting of titanium (Ti), tantalum (Ta), tungsten (W), zirconium (Zr), hafnium (Hf), molybdenum (Mo) and niobium (Nb).

11. The semiconductor device of claim 9, wherein the amorphous combination element (B) for preventing crystallization of the reactive metal (A) and the nitrogen (N) is silicon (Si) or boron (B).

12. The semiconductor device of claim 9, wherein the amorphous combination element (B) for preventing crystallization of the reactive metal (A) and the nitrogen (N) is aluminum (Al).

13. The semiconductor device of claim 9, wherein the electrical conductivity and resistance of the lower electrode is determined by the ratio of the number of depositions of an atomic layer of the amorphous combination element to the total number of depositions used for the lower electrode.

* * * * *